(12) United States Patent
Sato

(10) Patent No.: US 7,816,015 B2
(45) Date of Patent: Oct. 19, 2010

(54) COMPOSITE COPPER FOIL AND METHOD FOR PRODUCTION THEREOF

(75) Inventor: Yuushi Sato, Chikusei (JP)

(73) Assignee: Nippon Denkai, Ltd., Ibaraki (JP)

( * ) Notice: Subject to any disclaimer, the term of this patent is extended or adjusted under 35 U.S.C. 154(b) by 731 days.

(21) Appl. No.: 11/573,059

(22) PCT Filed: Jul. 22, 2005

(86) PCT No.: PCT/JP2005/013466

§ 371 (c)(1),
(2), (4) Date: Feb. 1, 2007

(87) PCT Pub. No.: WO2006/013735

PCT Pub. Date: Feb. 9, 2006

(65) Prior Publication Data

US 2007/0212566 A1    Sep. 13, 2007

(30) Foreign Application Priority Data

Aug. 2, 2004    (JP) .............................. 2004-225027

(51) Int. Cl.
*B32B 15/04* (2006.01)
*C23D 7/06* (2006.01)

(52) U.S. Cl. ..................... 428/607; 428/610; 428/629; 428/632; 428/664; 428/674; 205/76; 205/182

(58) Field of Classification Search ................. None
See application file for complete search history.

(56) References Cited

U.S. PATENT DOCUMENTS 6,346,335 B1 * 2/2002 Chen et al. .................. 428/629

2002/0036100 A1 * 3/2002 Slemmons et al. .......... 174/255

FOREIGN PATENT DOCUMENTS

| CN | 1386044 | 12/2002 |
|---|---|---|
| JP | 2001-301087 | 10/2001 |
| JP | 2002-292788 | 10/2002 |
| JP | 2003-094553 | 4/2003 |
| JP | 2003-286596 | 10/2003 |
| JP | 2004-169181 | 6/2004 |
| WO | WO 02/02444 A1 | 3/2002 |

OTHER PUBLICATIONS

Chinese Official Action dated Mar. 27, 2009, for Application No. 2005800257753.
Translation of the International Preliminary Report on Patentability, for Application No. PCT/JP2005/013466, dated May 3, 2007.

* cited by examiner

*Primary Examiner*—Jennifer C McNeil
*Assistant Examiner*—Adam C Krupicka
(74) *Attorney, Agent, or Firm*—Antonelli, Terry, Stout & Kraus, LLP.

(57) ABSTRACT

A composite copper foil having three layers of a supporting metal layer, an exfoliating layer and a thin copper layer, wherein one surface of the exfoliating layer comprises, as a main component, an alloy of tungsten or an alloy of molybdenum and the other surface thereof comprises, as a main component, a metal oxide containing tungsten or a metal oxide containing molybdenum. The composite copper foil is free from undesired swelling, separation or falling of the supporting metal layer during heating and working at a high temperature, and the supporting metal layer can be exfoliated from the thin copper layer with case, after the heating and the working.

16 Claims, No Drawings

COMPOSITE COPPER FOIL AND METHOD FOR PRODUCTION THEREOF

TECHNICAL FIELD

This invention relates to a composite copper foil, which is usable for the production of printed wiring boards and exhibits good stability in the peeling strength between its support metal layer and thin copper layer.

BACKGROUND ART

Support-bearing copper foil comprising a support metal layer, a release layer and a thin copper layer has been used in the production of ultra high density printed wiring boards. After the support-bearinq copper foil is laminated with a resin base material with the thin copper layer facing the resin base material and molded together, the support metal layer is peeled off, and the thin copper layer is then etching processed to form a circuit. As compared with methods using common copper foil having no support metal layer, this method is advantageous to form fine circuits because the thin copper layer may be formed thinner than the common copper foil.

Conventional release layers containing benzotriazole type organic compounds or inorganic compounds such as chromium oxide allow copper diffusing into the release layers at high temperatures, and make it difficult to peel off the release layers from support metal layers. It therefore has been proposed to provide the support metal layer or the thin copper layer with a layer that faces the release layer and prevents the diffusion of copper (for example, see Patent Document 1).

The above-described method successively prevents the diffusion of copper and suppresses the increase of peeling strength at high temperatures. However, due to the complicated layer structure and the interfacial destruction owing probably to difference in coefficient of thermal expansion or changes in crystal structures, the support metal layer spontaneously peels off from the thin copper layer. This results in a bad influence upon the workability and quality of copper clad laminates, such as the oxidative deterioration of the surface of the thin copper layer by exposure to hot air, or damage during cutting processing.

Patent Document 1: JP 2002-292788 A

DISCLOSURE OF INVENTION

Problem that the Invention is to Solve

The object of the present invention is to provide a composite copper foil improved in stability of the peeling strength between the support metal layer and thin copper layer thereof.

Means of Solving the Problem

The present invention provides a composite copper foil, which comprises three layers comprising a support metal layer, a release layer lying on the support metal layer, and a thin copper layer lying on the release layer, and is characterized particularly in that the release layer has one surface formed mainly of a tungsten alloy or a molybdenum alloy and the other surface formed mainly of a metal oxide containing tungsten or a metal oxide containing molybdenum. For example, in the release layer, the oxygen/metal ratio in the number of atoms on the surface formed mainly of a tungsten alloy or a molybdenum alloy is preferably 0.01 to 0.99, more preferably 0.10 to 0.60, and the oxygen/metal ratio in the number of atoms on the surface formed mainly of a metal oxide containing tungsten or a metal oxide containing molybdenum is preferably 1.0 to 9.0, more preferably 1.5 to 4.0.

The surface formed mainly of a metal oxide containing tungsten or a metal oxide containing molybdenum bonds the thin copper layer and the support metal layer together at such a bonding strength as to permit them to be peeled off from each other. The surface formed mainly of a tungsten alloy or a molybdenum alloy prevents mutual diffusion of copper atoms between the thin copper layer and the support metal layer through the release layer, and thus prevents the thin copper layer and the support metal layer from having increased bonding strength therebetween and becoming unpeelable. It is preferable that there is no clear interface in the release layer, so that the content of each component changes continuously, showing a gradual slope. This decreases the stress caused by difference in coefficient of thermal expansion or changesS of crystal structures and prevents accidentally spontaneous peeling. An example of such a release layer comprises a tungsten alloy and a metal oxide containing tungsten, has a content of the tungsten alloy decreasing continuously from the surface formed mainly of the tungsten alloy toward the surface formed mainly of the metal oxide containing tungsten, and has a content of the metal oxide containing tungsten decreasing continuously from the surface formed mainly of the metal oxide containing tungsten toward the surface formed mainly of the tungsten alloy. Another example of such a release layer comprises a molybdenum alloy and a metal oxide containing molybdenum, has a content of the molybdenum alloy decreasing continuously from the surface formed mainly of the molybdenum alloy toward the surface formed mainly of the metal oxide containing molybdenum, and has a content of the metal oxide containing molybdenum decreasing continuously from the surface formed mainly of the metal oxide containing molybdenum toward the surface formed mainly of the molybdenum alloy. For example, a composite copper foil having such a release layer may be produced according to the production method of the present invention, which comprises forming sequentially the release layer and the thin copper layer on the support metal layer by electroplating, wherein the release layer is formed by using an electrolytic solution which contains a tungstic acid compound or a molybdic acid compound, a compound containing an iron family element and citric acid.

Effect of the Invention

The composite copper foil of the present invention is advantageously suitable for the production of high density printed wiring boards, because it suffers little increase in peeling strength at high temperatures and is freed from the problem that the support metal layer spontaneously peels from the thin copper layer during processing to adversely affect the workability and quality of copper clad laminates.

Best Mode for Carrying out the Invention

The support metal layer used in the present invention is not limited in material and thickness, and is preferably a copper foil of 8 to 35 μm thick from the viewpoints of cost, production processes, mechanical properties and chemical properties. Its surface roughness is preferably large in cases where higher bonding strength is required between the thin copper layer and resin base materials, while it is preferably small to form fine circuits. It is also preferably small in cases where the thin copper layer is very thin.

Before the release layer is formed, the surface of the support metal layer is preferably cleaned by a proper pretreatment. The pretreatment may be a conventional acid washing, or may be alkali degreasing or electrolytic cleaning.

The release layer used in the present invention may be formed by an electroplating process using the support metal layer as a cathode in an electrolytic solution that contains a tungstic acid compound or a molybdic acid compound, a compound containing an iron family element and citric acid. The iron family element is preferably nickel. The electrolytic solution may contain an inorganic salt, such as sodium sulfate, to control the value of resistance. The content of each of the tungstic acid compound or the molybdic acid compound is generally 0.1 to 10 g/l, preferably 0.5 to 2 g/l as metal. The content of the compound containing an iron family element is generally 0.6 to 60 g/l, preferably 3 to 12 g/l as metal. The concentration of citric acid in moll conversion is generally 0.2 to 5 times, preferably 0.5 to 2 times as much as the metals excluding sodium ion, namely the total molls of the tungstic acid compound and the compound containing an iron family element or the total molls of the molybdic acid compound and the compound containing an iron family element. Examples of usable tungstic acid compounds include tungstates or hydrates thereof, such as sodium tungstate dihydrate. Examples of usable molybdic acid compounds include molybdates or hydrates thereof, such as sodium molybdate dihydrate. Examples of usable compounds containing an iron family element include nickel salts or hydrates thereof, such as nickel sulfate hexahydrate. Examples of citric acid sources include citrates or hydrates thereof, such as sodium citrate dihydrate. The electrolytic solution generally contains water as a solvent. The temperature of the electrolytic solution is generally 5 to 70° C., preferably 10 to 50° C. Current density is generally 0.2 to 10 $A/dm^2$, preferably 0.5 to 5 $A/dm^2$. The value of pH is generally 2 to 8, preferably 4 to 7. When electroplating is carried out under the above-described conditions, metals mainly deposit first, and oxides mainly deposit as the electroplating proceeds. The surface formed mainly of oxides exhibits release function, while the surface formed mainly of metals inhibits the integration of layer structures due to the thermal diffusion of copper atoms. The thickness and components of the release layer vary depending on the composition of the electrolytic solution and the conditions of electrolysis. The release layer generally becomes 0.005 to 0.5 µm thick.

The release layer may be formed in one stage, or by carrying out electroplating repeatedly. The electroplating may be repeated in one electrolytic bath, or in two or more electrolytic baths. Repeating the electroplating further improves the stability of peeling strength.

The method of forming the thin copper layer is not limited, and in case an electrolytic solution mainly containing copper pyrophosphate is used, a dense copper layer is plated, to decrease pinholes. In case an electrolytic solution mainly containing copper sulfate is used, plating proceeds speedily so that the thin copper layer can be formed efficiently. Combined use of the two plating methods enables efficient production of a thin copper layer having a desired thickness and lesser pinholes. The thickness of the thin copper layer may be varied depending on the use of the composite copper foil. The thickness is preferably 0.1 to 10 µm to produce fine circuits, but may be thicker. In case the composite copper foil of the present invention is produced by this method, the surface of the release layer contacting the thin copper layer is formed mainly of oxides. The surface therefore has weak boding strength, so that the release layer remains on the support metal layer.

The surface of the thin copper layer may be roughened to enhance the adhesiveness to resin base materials by any known method, and may be treated for anticorrosion by any known method, such as chromate treatment. Also, according to demands, it may be subjected to adhesion enforcement treatments with silane coupling agents or the like to improve the adhesiveness to resin base materials.

In the composite copper foil produced by the above-described production method according to the present invention, the tungsten alloy is an alloy containing tungsten and an iron family element, the molybdenum alloy is an alloy containing molybdenum and an iron family element, the metal oxide containing tungsten contains tungsten oxide and an oxide of an iron family element, and the metal oxide containing molybdenum contains molybdenum oxide and an oxide of an iron family element.

The composite copper foil of the present invention may be laminated with a resin base material with the thin copper layer of the composite facing the resin base material and then molded to produce a copper clad laminate, which may be used for the production of a printed wiring board. The composite copper foil may also be coated with a solution of a resin base material and then heated to produce a copper clad resin film, which may be used for the production of a printed wiring board. When a printed wiring board is produced, the support metal layer and the release layer is peeled off from the copper clad laminate or the copper clad resin film, and then circuits are formed by etching the thin copper layer, to give a printed wiring board. Examples of usable resin base material contain at least one of a polyimide resin, an epoxy resin, a maleimide resin, a triazine resin, a polyphenylene ether resin and a polybutadiene resin. Usable polyimide resins include, for example, polyimides and polyamideimides, and precursors thereof, such as polyamic acids. The resin base material generally used for the production of copper clad laminates is prepreg produced by impregnating glass cloth or the like with at least one of the above-described resins. A resin base material solution containing at least one of the above-described resins is generally used for the production of the copper clad resin film.

EXAMPLES

In each Example, an electrolytic copper foil of 18 µm thick was used as a support metal layer. The surface of the copper foil was cleaned by cathodic treatment in sulfuric acid. The cleaned copper foil was used as a cathode (anode: Ti-based indium oxide coating) to form release layer 1 on its shiny surface under the conditions as shown in Table 1 (pH of the electrolytic solution: 6.0, temperature: 30° C.). In Example 2, after the cathodic treatment was carried out for 20 seconds under the conditions as shown in Table 1, electric current was switched off for 10 seconds, and then the cathodic treatment was resumed and continued for 20 seconds under the same conditions.

After the formation of release layer 1, a thin copper layer of 3.9 µm thick was formed thereon by using a copper pyrophosphate plating bath and a copper sulfate plating bath in sequence. The formation of the thin copper layer was carried out under the following conditions.

(1) Copper Pyrophosphate Plating

Composition of electrolytic solution: copper pyrophosphate 80 g/l, potassium pyrophosphate 320 g/l, aqueous ammonia 2 ml/l pH: 8.5

Current density: 2.0 A/dm$^2$
Time: 20 seconds
Temperature: 40° C.

(2) Copper Sulfate Plating
Composition of electrolytic solution: copper sulfate 200 g/l, sulfuric acid 100 g/l
Current density: 3.5 A/dm$^2$
Time: 300 seconds
Temperature: 40° C.

After fine roughening of 1 μm was carried out by a known method, chromate treatment and silane coupling treatment were carried out, to produce composite copper foils A to D. For comparison, a composite copper foil E was produced in the same manner as in the production of composite copper foils A to D except that release layer 2 and release layer 3 were sequentially produced in place of release layer 1.

The release layer was peeled off from each of composite copper foils A to E, and the surface of the release layer remaining on the support metal layer was then subjected to XPS analysis while the release layer was etched with argon ion in a direction of depth. The results are shown in Table 1. Copper metal was excluded from the calculation of the ratio of oxygen atoms to metal atoms. It was observed that oxygen was mainly detected at the beginning of etching, and decreased as the etching proceeded. This shows that molybdenum or tungsten existed mainly as oxides on the surface observed at the beginning of etching, namely the surface that had been in contact with the thin copper layer, while existed mainly as metal on the surface that had been in contact with the support metal layer.

The peeling strength between the support metal layer and the thin copper layer was measured according to JIS C6481 by peeling off the thin copper layer from each of the composite copper foils A to E without heating them. The results are listed in Table 1. Further, each of the composite copper foils A to E was laminated with glass cloth-based epoxy resin prepreg (corresponding to FR-5) so that the thin copper layer faced the base material, and then pressed at 260° C., 30 kN/m$^2$, for 60 minutes, to give a copper clad laminate. Each of the composite copper foils A to E was also coated with a commercial polyamic acid solution, dried at 120° C. for 100 minutes and then at 200° C. for 20 minutes, and was then subjected to imidation by heating at 450° C. for 10 minutes, to give a copper clad polyimide resin film. The peeling strength between the support metal layer and the thin copper layer was measured according to JIS C6481, and the results are shown in Table 1. In Table 1, "260° C./60 min" means the heating conditions for the pressing during the production of the above-described copper clad laminate, and "450° C./10 min" means the heating conditions for the imidation during the production of above-described copper clad polyimide resin film.

The support metal layer of the copper clad polyimide resin film produced by using composite copper foil E peeled off spontaneously, and the surface of the thin copper layer changed its color due to oxidation. On the other hand, the copper clad polyimide resin films produced by using composite copper foils A to D had peeling strength of 20 to 280 kN/m, and after peeling, the surface of the thin copper layers had a general metallic gloss and a hue peculiar to metal.

TABLE 1

| Composite copper foil | | | Ex. 1 A | Ex. 2 B | Ex. 3 C | Ex. 4 D | Comp. Ex. 1 E |
|---|---|---|---|---|---|---|---|
| Release layer 1 | Bath Composition (g/l) | NiSO$_4$•6H$_2$O | 30 | 30 | 30 | 30 | — |
| | | Na$_2$MoO$_4$•2H$_2$O | 3 | 3 | 3 | — | — |
| | | Na$_2$WO$_4$•2H$_2$O | — | — | — | 3 | — |
| | | Na$_3$C$_6$H$_5$O$_7$•2H$_2$O | 30 | 30 | 30 | 30 | — |
| | | Na$_2$SO$_4$ | 30 | 30 | 30 | 30 | — |
| | Current density (A/dm$^2$) | | 3 | 3 | 3 | 3 | — |
| | Electrolysis period (sec) | | 40 | 20 +20 | 20 | 20 | — |
| Release layer 2 | Bath composition (g/l) | NiSO$_4$•6H$_2$O | — | — | — | — | 300 |
| | | H$_3$BO$_3$ | — | — | — | — | 40 |
| | | H$_3$PO$_3$ | — | — | — | — | 0.5 |
| | | MgSO$_4$•6H$_2$O | — | — | — | — | 80 |
| | | Sodium saccharinate | — | — | — | — | 2 |
| | Current density (A/dm$^2$) | | — | — | — | — | 5.4 |
| | Electrolysis period (sec) | | — | — | — | — | 20 |
| Release layer 3 | Bath composition (g/l) | Na$_2$MoO$_4$•2H$_2$O | — | — | — | — | 2 |
| | | Na$_2$Cr$_2$O$_7$•2H$_2$O | — | — | — | — | 2 |
| | Current density (A/dm$^2$) | | — | — | — | — | 5.4 |
| | Electrolysis period (sec) | | — | — | — | — | 20 |
| Peeling strength (N/m) | No heating | | 20 | 20 | 20 | 10 | 20 |
| | 260° C./60 min | | 20 | 20 | 20 | 10 | 20 |
| | 450° C./10 min | | 90 | 20 | 160 | 280 | Spontaneous peeling |
| Oxygen/metal in release layer (ratio in the number of atoms) | etching: 0 sec | | 3.6 | 3.3 | 3.3 | 3.4 | 5.8 |
| | etching: 30 sec | | 1.6 | 0.9 | 1.2 | 1.2 | 0.1 |
| | etching: 60 sec | | 0.9 | 0.8 | 0.7 | 0.8 | 0.1 |
| | etching: 120 sec | | 0.6 | 0.6 | 0.6 | 0.6 | 0.0 |
| | etching: 240 sec | | 0.5 | 0.5 | 0.5 | 0.5 | 0.0 |

INDUSTRIAL APPLICABILITY

The composite copper foil of the present invention is advantageously suitable for the production of high density printed wiring boards, because it suffers little increase in peeling strength at high temperatures and is freed from the problem that its support metal layer spontaneously peels from its thin copper layer during processing to adversely affect the workability and quality of copper clad laminates.

The invention claimed is:

1. A composite copper foil, comprising three layers comprising a support metal layer, a release layer lying on the support metal layer, and a thin copper layer lying on the release layer, wherein:
   (1) the release layer comprises a tungsten alloy and a metal oxide containing tungsten, has one surface formed mainly of the tungsten alloy and the other surface formed mainly of the metal oxide containing tungsten, has a content of the tungsten alloy decreasing continuously from the surface formed mainly of the tungsten alloy toward the surface formed mainly of the metal oxide containing tungsten, and has a content of the metal oxide containing tungsten decreasing continuously from the surface formed mainly of the metal oxide containing tungsten toward the surface formed mainly of the tungsten alloy; or
   (2) the release layer comprises a molybdenum alloy and a metal oxide containing molybdenum, has one surface formed mainly of the molybdenum alloy and the other surface formed mainly of the metal oxide containing molybdenum, has a content of the molybdenum alloy decreasing continuously from the surface formed mainly of the molybdenum alloy toward the surface formed mainly of the metal oxide containing molybdenum, and has a content of the metal oxide containing molybdenum decreasing continuously from the surface formed mainly of the metal oxide containing molybdenum toward the surface formed mainly of the molybdenum alloy.

2. The composite copper foil according to claim 1, wherein the support metal layer is a copper foil.

3. The composite copper foil according to claim 1, wherein the tungsten alloy is an alloy containing tungsten and an iron family element, the molybdenum alloy is an alloy containing molybdenum and an iron family element, the metal oxide containing tungsten contains a tungsten oxide and an oxide of an iron family element, and the metal oxide containing molybdenum contains a molybdenum oxide and an oxide of an iron family element.

4. The composite copper foil according to claim 3, wherein the iron family element is nickel.

5. The composite copper foil according to claim 1, wherein the surface formed mainly of the tungsten alloy or the molybdenum alloy is in contact with the support metal layer, and the surface formed mainly of the metal oxide containing tungsten or the metal oxide containing molybdenum is in contact with the thin copper layer.

6. The composite copper foil according to claim 1, wherein the release layer comprises the tungsten alloy and the metal oxide containing tungsten.

7. The composite copper foil according to claim 6, wherein in the release layer, the oxygen/metal ratio, in number of atoms, on the surface formed mainly of the tungsten alloy, is 0.01 to 0.99, and the oxygen/metal ratio, in the number of atoms, on the surface formed mainly of the metal oxide containing tungsten, is 1.0 to 9.0.

8. The composite copper foil according to claim 1, wherein the release layer comprises the molybdenum alloy and the metal oxide containing molybdenum.

9. The composite copper foil according to claim 8, wherein in the release layer, the oxygen/metal ratio, in number of atoms, on the surface formed mainly of the molybdenum alloy, is 0.01 to 0.99, and the oxygen/metal ratio, in the number of atoms, on the surface formed mainly of the metal oxide containing molybdenum, is 1.0 to 9.0.

10. The composite copper foil according to claim 1, wherein the release layer has a thickness in a range of 0.005 to 0.5 μm thick.

11. A method of producing the composite copper foil of claim 1, comprising forming sequentially the release layer and the thin copper layer on the support metal layer by electroplating, wherein the release layer is formed by using an electrolytic solution which contains a tungstic acid compound or a molybdic acid compound, a compound containing an iron family element and citric acid.

12. The method of claim 11, wherein the support metal layer is a copper foil, and the iron family element is nickel.

13. A method of producing a printed wiring board, comprising using a copper clad laminate which is formed by laminating the composite copper foil of claim 1 and a resin base material together, with the thin copper layer of the composite copper foil facing the resin base material, and then molding.

14. The method according to claim 13, wherein the resin base material contains at least one of a polyimide resin, an epoxy resin, a maleimide resin, a triazine resin, a polyphenylene ether resin and a polybutadiene resin.

15. A method of producing a printed wiring board, comprising using a copper clad resin film which is formed by coating the surface of the thin copper foil layer of the composite copper foil of claim 1 with a solution of a resin base material and then heating.

16. The method according to claim 15, wherein the resin base material contains at least one of a polyimide resin, an epoxy resin, a maleimide resin, a triazine resin, a polyphenylene ether resin and a polybutadiene resin.

* * * * *